(12) United States Patent
Coddington et al.

(10) Patent No.: US 6,294,938 B1
(45) Date of Patent: *Sep. 25, 2001

(54) SYSTEM WITH DLL (75) Inventors: John Deane Coddington, Cedar Park; Chau-Shing Hui, Austin, both of TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/552,824

(22) Filed: Apr. 20, 2000

Related U.S. Application Data (62) Division of application No. 09/236,775, filed on Jan. 25, 1999.

(51) Int. Cl.[7] .................................................. H03L 7/06
(52) U.S. Cl. ...................... 327/158; 327/291; 327/149; 327/245; 327/270; 327/237
(58) Field of Search .................................. 327/158, 291, 327/149, 245, 270, 237

(56) References Cited

U.S. PATENT DOCUMENTS

| | | | |
|---|---|---|---|
| 4,689,581 | 8/1987 | Talbot | 331/1 A |
| 5,271,040 | 12/1993 | Clark | 375/81 |
| 5,373,255 | 12/1994 | Bray et al. | 331/1 A |
| 5,719,856 | 2/1998 | May | 370/282 |
| 5,995,441 | 11/1999 | Kato et al. | 365/233 |
| 6,028,463 | 2/2000 | Albu et al. | 327/291 |
| 6,140,854 | * 10/2000 | Coddington et al. | 327/158 |
| 6,212,126 | * 4/2001 | Sakamoto | 365/233 |

* cited by examiner

*Primary Examiner*—Dinh T. Le
(74) *Attorney, Agent, or Firm*—James L. Clingan, Jr.

(57) ABSTRACT

A system (50) has a shifting delay circuit (60) which provides a variable delay for delaying a source clock and a delay locked loop (DLL) (70) which includes a delay line (72) which provides a variable delay for delaying the source clock. The delay line (18) has its delay varied by a counter (74). The counter (74) is incremented in order to change the delay. The shifting delay circuit (60) is based on half periods of a reference clock (GCLK) which has a known relationship to the source clock. The total delay for the source clock is a combination of that provided by shifting delay circuit (60) and delay line (72). The delay line (72), which requires relatively large amounts of die area in an integrated circuit can be smaller in size due to the usage of shifting delay circuit (60).

13 Claims, 4 Drawing Sheets

SYSTEM WITH DLL

This application is a Div. of Ser. No. 09/236,775 filed Jan. 25, 1999.

FIELD OF THE INVENTION

The field of the invention is systems which synchronize clocks and more particulary to systems which use delay lock loops.

BACKGROUND OF THE INVENTION

In a typical processing system there is an oscillator which generates a master clock for operating all the circuits within that system. The clocks which operate the system are all generated from the same master clock oscillator. The individual clocks that are generated must operate in a known relationship to each other. In general, these clocks are desirably operated in precise phase with one another. This is typically achieved with the use of phase lock loops (PLLs) and delay lock loops (DLLs). PLLs are very effective in synchronizing clocks to one another, and DLLs are also used for this purpose. Sometimes different elements of the system have different interfaces and are operating at different frequencies. When this is the case, it is necessary that there be two locking mechanisms. One would be a normal PLL which is analog, and the other would be a DLL. The reason for using a DLL instead of two PLLs is that the transfer functions of two PLLs would be very similar to each other and could result in the two resonating together. A DLL has a substantially different transfer function than a PLL so that the likelihood of them resonating can be completely discounted.

One of the problems with DLLs is that there is necessarily a variable delay included in the DLL and the magnitude of that variable delay is advantageously large for functional reasons, but disadvantageously large because it then requires more space on the integrated circuit die. Thus there is a trade-off between functionality and efficient use of space on the integrated circuit die. For a reasonable sized delay, there are two major problems that have existed. One is that lock of the two clocks being synchronized may occur when the amount of delay is very close to zero or very close to the maximum amount of delay. In such a case, a slight change can cause the delay to switch between the maximum and the minimum delay. The reason for this is that there is a counter which controls the amount of delay which counts from all zeros to all ones. When this counter is incremented from the all ones state it will cycle around to the all zeros state. Similarly if the counter is in the all zeros condition and is decremented, it will cycle to the all ones state. If the counter, in the lock condition, is near or at all ones, a small increase will force it to the all zeros condition. This will result in going from a maximum delay to the minimum delay and thus losing lock. Similarly, if it's at near zero in delay so that the counter is at near all zeros and there needs to be a reduction in the amount of delay to retain lock, the counter can go from all zeros to all ones, in which case it goes from the minimum delay to the maximum delay again causing the loss of lock.

Another problem is that if the amount of delay provided in the DLL is not large enough, then it may not be possible to obtain lock if the system is not designed with this in mind. The margin for error in being able to obtain lock may not be adequate. There may be designs that are perfectly reasonable for a circuit board for other criteria, but which will result in requiring an amount of delay not available and thus not attaining lock. Although systems can nearly always be designed so as to require less delay, those kinds of re-designs may not be the kind that a customer or user would want to do. These things can cause delays in bringing a product to market, there may be large re-design costs, or it may be an issue of allocation of resources that is not available or is very costly to the user.

Figure 1:
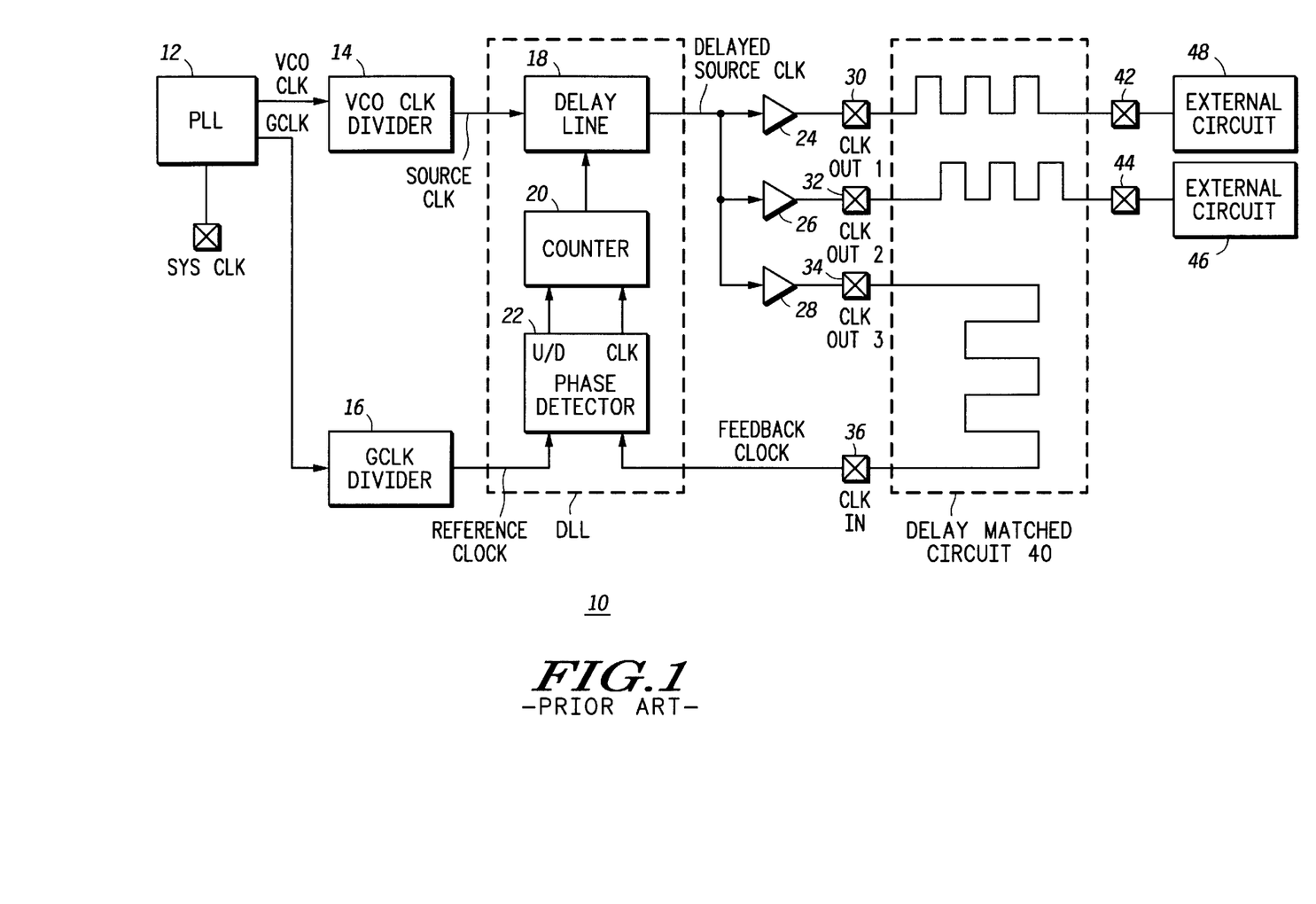
FIG. 1 illustrates in block diagram form a system using a DLL according to the prior art.

Thus, there is a need for a DLL which can attain lock for a wide range of delay requirements and can avoid attaining lock at the counter boundaries. Shown in FIG. 1 is a system using a DLL according to the prior art which has the two shortcomings described above. Shown in FIG. 1 is a system 10 comprising a PLL 12, a divider 14 shown as VCO CLK divider 14, a divider 16 shown as G clock (GCLK) divider 16, a delay line 18, a counter 20, a phase detector 22, a buffer 24, a buffer 26, a buffer 28, an output pad 30, an output pad 32, an output pad 34, an input pad 36, a delay matched circuit 40, connections 42 and 44, an external circuit 46, and an external circuit 48. Typically, except for delay matched circuit 40, external pads 42 and 44, and external circuits 46 and 48, system 10 would be a single integrated circuit which would have many other elements, such as an ALU, included. Delay line 18, counter 20, and phase detector 22 are typical elements of a DLL. For functionality, of course, there must a source for two clocks, such as PLL 12, VCO CLK divider 14, and GCLK divider 16 coming into the DLL In operation PLL 12 receives an input system clock (SYSCLK) and provides two clock outputs. One clock operates at twice the frequency of the other. The one operating at the higher frequency is VCO CLK and the one operating at the lower frequency is GCLK. Divider 14 divides VCO CLK by an integer which is at least 2, and divider 16 divides GCLK by half of what divider 14 performs its division by. Divider 14 provides, as an output, a source clock to delay line 18. Divider 16 provides a reference clock to phase detector 22. The source clock must have a 50% duty cycle. The reference clock does not have the same requirement. Delay line 18 receives an input from counter 20 and, based on the output of counter 20, provides delayed source clock to output buffers 24, 26, and 28 which are phased delayed in relation the source clock. Output buffers 24, 26, 28 provide clock out 1, clock out 2, and clock out 3, respectively, on output pads 30, 32, and 34, respectively, in response to the delayed clock. Delay matched circuit 40 is coupled to output pads 30, 32, and 34; to external pads 42 and 44; and to input pad 36. External pads 42 and 44 receive clock out 1 and clock out 2 for use by external circuits 48 and 46 via delayed match circuit 40. Delayed match circuit 40 is also coupled to output pad 34 which carries clock out 3 to input pad 36. Delayed match circuit 40 is for the purpose of, as best as is reasonably possible, matching delays so that the delay between pad 30 and 42, the delay between 32 and 44, and the delay between 34 and 36 are the same. Phase detector 22 receives a feedback clock from pad 36 and the reference clock from divider 16.

In operation phase detector 22 compares the phase relationship of these two clocks and provides an output U/D (up/down) to counter 20. Phase detector 22 provides a clock output to counter 20 to inform the counter if it is to be changed and at the precise time for that change to occur. One technique is to make a determination every five clock cycles. Thus, if changes are needed, a change will only occur on every fifth clock cycle. The U/D signal indicates to the counter if it is to be incremented or decremented and the clock output provides the timing for such increment or decrement. The magnitude of the counter change is limited to an increment or decrement of one for any given occurrence of the clock output. Counter 20 provides an output to delay line 18 which selects the magnitude of the delay. Source clock is delayed to provide the delayed source clock by the amount of delay selected by counter 20. For the case when the feedback clock is leading reference clock, the counter is incremented to increase the amount of delay. When the feedback clock is lagging the reference clock, counter 20 is decremented to reduce the amount of delay in delay line 18. When the feedback clock and the reference clock are in phase, phase generator 22 does not provide the output clock to counter 20.

With this configuration, if delay line 18 has an available delay less than the period of the source clock, there can be the two major problems previously described. One of the problems is that there may not be enough delay available in delay line 18 in order to attain lock at all. In such a case, the user needs to increase the amount of delay in delay matched circuit 40 or elsewhere in order to add sufficient delays so as to obtain lock. If the amount of delay is in the nanosecond range, this could be very space consuming and space which may not be available on the delay match circuit board. For example, a nanosecond of delay on a circuit board using wire only is approximately 20 centimeters. If there are several nanoseconds required, this could be in the range of a third of a meter or even more of wire required to obtain the necessary delay. The other problem is that if lock occurs at the counter boundary or if the lock occurs when the counter is at near all zeros or near all ones, there is very little flexibility left if there is a change in the delay which must be matched by delay 18. The change in delay occurs through temperature changes which could effect the delay in match circuit 40 and buffers 24, 26, and 28. These kinds of changes occur due to temperature changes which are inevitable. When these temperature changes do occur, there is consequent change in delay. The counter may have to increment up when it is already in the all ones condition. In such a condition, it will roll over to all zeros so the delay line 18 provides no delay when it was previously providing maximum delay and more delay was needed. This will result in the loss of lock. Similarly, if the counter is at all zeros, and must be decremented, it will decrement to all ones and delay line 18 will then instead of providing the minimum delay, provide the maximum delay, again causing the loss of lock.

DETAILED DESCRIPTION OF THE PREFERRED EMBODIMENT

Figure 2:
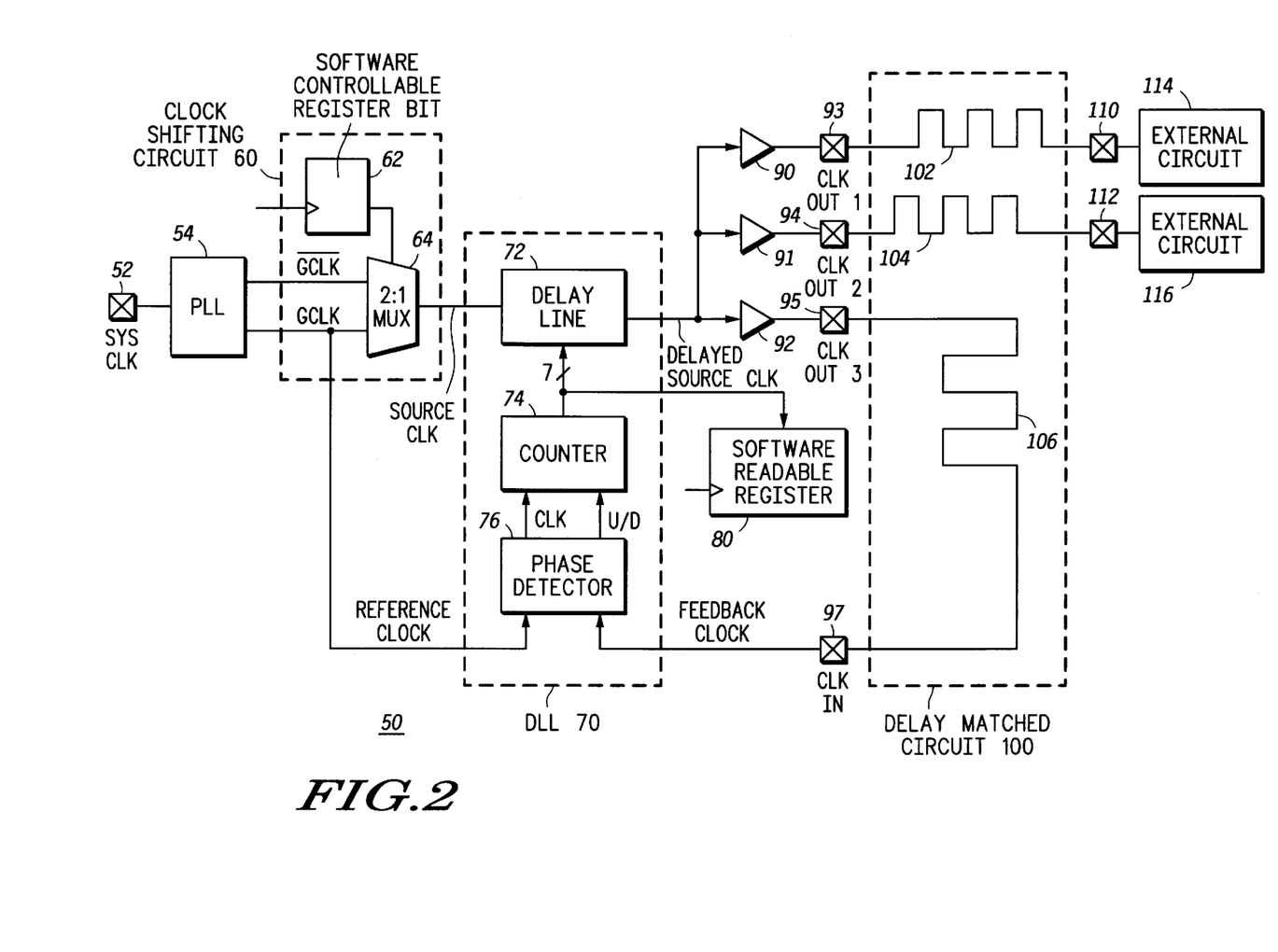
FIG. 2 illustrates in block diagram form an embodiment of the invention.

Shown in FIG. 2 is system 50 which comprises an input pad 52 for receiving a system clock (SYS CLK), a PLL 54, a clock shifting circuit 60, a software controllable register bit 62, a 2:1 mulitplexor (mux) 64, a delay line 72, a counter 74, a phase detector 76, an output buffer 90, an output buffer 91, an output buffer 92, an output pad 93, an output pad 94, an output pad 95, a software readable register 80, an input pad 97, a delay matched circuit 100, an external pad 110, an external pad 112, an external circuit 114, and an external circuit 116. Similar to the case with system 10 in FIG. 1, system 50 would preferably be an integrated circuit except for delayed matched circuit 100, external pads 110 and 112, and external circuits 114 and 116. Such an integrated circuit would also have other elements not shown in FIG. 2 which among other functions would provide a user of system 50 to the ability to load software controllable register bit 62 and to read software readable register 80. Software controllable register bits and software readable registers are well known in the art. Software controllable register bit 62 and mux 64 together form a clock shifting circuit 60.

PLL 54 receives SYS CLK from pad 52 and provides GCLK and GCLK_ to mux 64. Phase detector 76 receives GCLK. Software controllable register bit 62 controls mux 64. One of the clock inputs, either GCLK or GCLK_ is passed to delay line 72 in response to the state of software controllable register bit 62. Delay line 72 provides delayed source clock as an output with the delay corresponding to counter 74's output. Input buffers 90, 91, and 92 each have an input for receiving delayed source clock. Output pads 93, 94, and 95 are coupled to outputs of input buffers 90, 91, and 92, respectively. External pads 110 and 112 receive clock out 1 and clock out 2, respectively, from pads 93 and 94, respectively, via delayed match circuit 100. External circuits 114 and 116 are coupled to external pads 110 and 112, respectively. Pad 95 is coupled to pad 97 by way of delayed match circuit 100 and provides clock out 3 to pad 97 via delay match circuit 100. Counter 74 provides an output to software readable register 80.

System 50 has some similarities to system 10 in FIG. 1. Delay line 72 responds to counter 74 and provides a delay corresponding to the count provided in 74. Phase detector 76 receives feedback clock and reference clock and compares the two. If reference clock and feedback clock are in phase, then phase detector 76 provides no clock output and counter 74 does not change. If feedback clock is leading reference clock, then phase detector 76 provides a clock output and increments counter 74. If feedback clock lags reference clock, then phase detector 76 decrements counter 74. Phase detector 76 has a clock output and an up/down output to provide this functionality for counter 74. Delay line 72, counter 74, and phase detector 76 together can be considered a DLL 70.

There are also differences between system 10 and system 50 and such differences relate to improving the two problems previously identified with system 10. The output of counter 74 is loaded into software readable register 80. If lock is attained when delay line 72 is at either the minimum or maximum delay, this is indicated by the output of counter 74. Software can be implemented to read the condition of register 80 and, thus, the state of counter 74. If counter 74 is very low, at or near all zeros, then delay line 72 is at or near its minimum delay. If counter 74 is at or near all ones, then delay line 72 is at or near its maximum delay. These are undesirable conditions. If such is the case, software controllable register bit 62 can be changed to switch source clock 22 being provided by the alternative of GCLK or GCLK_. PLL 54 provides GCLK and GCLK_ as complementary signals, each with a 50% duty cycle. If lock was obtained with GCLK being multiplexed to be the source clock which is input to delay line 72, then the switching to GCLK_ will result in an effective delay shift of one-half the period of GCLK. The immediate effect is that delay line 72 receives a clock input which is shifted in delay by one half the period of GCLK. To compensate for this change in delay on its input, delay line 72 must shift its delay by the same amount in order to obtain lock. After the time required to obtain lock after the change in mux 64, counter 74 will have altered its output so that it is no longer near the all ones or all zeros condition. For the case when the period of GCLK and the maximum delay of delay line 72 are approximately the same, a shift from lock being near the all zeros or all ones condition will result in delay line 72 being near the middle of its maximum delay.

Software controllable register bit 62 can also be used if lock cannot be obtained with GCLK being passed to delay 72. Setting software controllable bit 62 so that mux 64 switches to passing GCLK_ has the effect of adding half the period of GCLK to the range of delay line 72. Thus, there is that much more delay available in order to increase the chances of obtaining lock.

In general a system, such as system 50, will have a specification for the frequency range, both the highest and the lowest frequency, for GCLK. Lock may occur at any location in the phase of GCLK. In the prior art such as system 10 in FIG. 1, the delay of the delay line 18 needed to at least equal the period of the source clock in order to ensure lock. Lock could then occur anywhere along the phase of the source clock. In system 50, however, the use of clock shifting circuit 60 allows for ensuring lock if the delay of delay line 72 is only half the period of the source clock. Taking into account that is an essentially linear relationship between the amount of delay and the size of the circuit providing the delay system 50 can have delay line 72 be half the size of that of delay line 18 of FIG. 1 and still ensure lock for the same specified low frequency. The added size for having clock shifting circuit 60 is far less than that for doubling the delay of delay line 72. In order to get the full benefit of avoiding the all zero and all ones condition, delay line 72 should be something more than half of the period of slowest specified GCLK. The amount more than half is the amount of margin that should be present to ensure avoiding being too near the all zeros or all ones condition. The amount of margin would determined by the maximum amount of change in system delay that would occur in operation. A typical expected maximum change would be 0.5 to 1.0 nanoseconds (ns). In such case the delay of delay line 72 would preferably be one half the period of the slowest specified frequency plus 0.5 to 1.0 ns.

An advantage of the addition of clock shifting circuit 60 is that of increasing the effective range of lock for a given delay of delay line 72. Another advantage, in combination with using software readable register 80, is that lock near the all zeros or all ones condition can be avoided.

Figure 3:
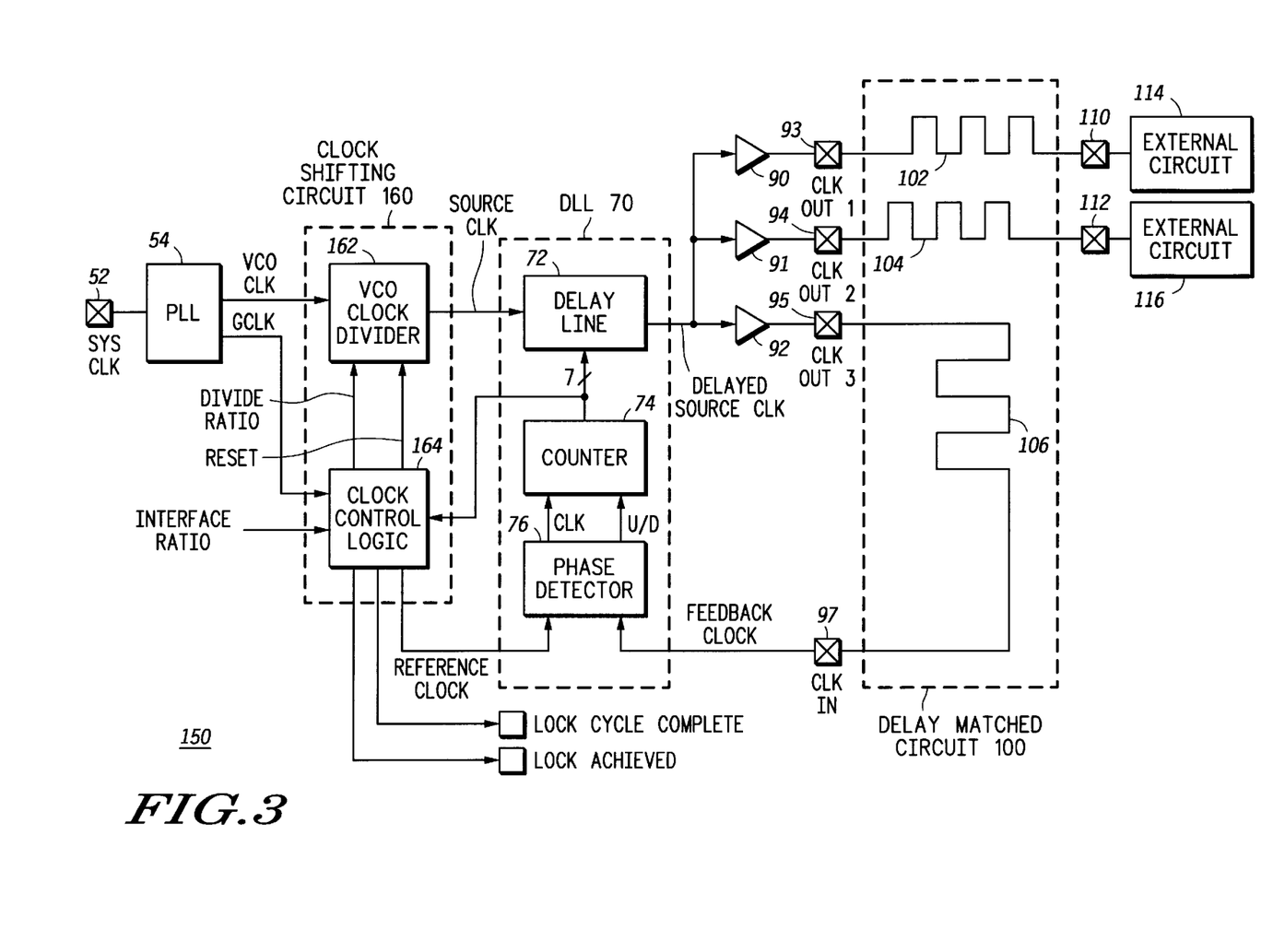
FIG. 3 illustrates in block diagram form another embodiment of the invention.

Shown in FIG. 3 is a system 150 comprising a pad 52, a PLL 54, a VCO clock divider 162, clock control logic 164, delay line 72, counter 74, phase detector 76, buffer 90, buffer 91, buffer 92, output pad 93, output pad 94, output pad 95, input pad 97, matched delay circuit 100, external pads 110, 112, and external circuits 114 and 116. Similar numbers are used for the features that are the same between FIGS. 2 and 3. VCO clock divider 162 in FIG. 3 is operationally similar to mux 64 in FIG. 2, except that VCO clock divider 162 can be controlled to provide a larger number of possibilities for the delay of the source clock than just the two possibilities provided by mux 64.

Clock control logic 164 provides the control of VCO clock divider 162 to provide a selectable delay using a divide ratio signal and a reset signal, provides the lock cycle complete output and the lock achieved output, and receives interface ratio signals which provide information as to the ratio of the frequency of VCO clock to GCLK and the ratio of source clock to GCLK. VCO clock divider 162 divides VCO clock in response to the divide ratio signal provided by clock control logic 164. The division performed by VCO clock divider 162 is determined by the interface ratio provided to clock control logic 164. For example, if VCO clock is operating at a frequency four times that of GCLK, and it is desired that source clock be half of GCLK, then VCO clock divider 162 would have to divide VCO clock by 8. In practice, GCLK should be at least half or less of VCO clock. The reason for this is that VCO clock is the highest frequency clock output by PLL 54 and may or may not have a 50% duty cycle. It is desirable that GCLK and source clock each have a 50% duty cycle. The 50% duty cycle is obtained by dividing the higher frequency clock by some number such as 2. Thus, VCO clock divider 162 must divide VCO clock by at least 2 in order to ensure that the source clock is operating at a 50% duty cycle. PLL 54 itself performs the division of VCO clock to provide GCLK with a 50% duty cycle.

With clock control logic 164 receiving GCLK and thus both the rising and falling edges thereof, the resolution is available to provide either timing off of the rising or falling edge of that clock to VCO clock divider 162. Thus, VCO clock divider 162 can be adjusted to have a delay in increments of one-half the period of GCLK. VCO clock divider 162 and clock control logic 164 together can be considered a clock shifting circuit 160. As shown in both FIGS. 2 and 3, delay line 72, counter 74 and phase detector 76 can together be considered a DLL 70. The primary difference between FIG. 3 and FIG. 2 is that clock shifting circuit 160 has more flexibility than does clock shifting circuit 60 which is the combination of software controllable register bit 62 and 2:1 multiplexer 64. If there is a difference in frequency between GCLK and source clock, specifically GCLK is faster than source clock, there can be more incremental changes available for VCO clock divider 162 in the amount of delay that is provided. That is, there are instead of just one-half of the period of source clock, there may be smaller divisions available than that. Another function of clock control logic 164 is as a divider of GCLK and this divider should be one with half modes. That is, for example, it should be able to divide by three and a half. This is desirable because VCO clock divider should be able to divide by any integer greater than one. Thus, for the case where and GCLK is half the VCO clock and VCO clock divider 162 divides by 7, clock control logic 164 needs to be able to divide by 3 and one half to provide the reference clock to phase detector 76 at the same frequency as the source clock is provided by VCO clock divider 162. It should be understood that when a clock signal is described as being divided or has having a ratio to another clock signal, it is the frequency of that clock signal that is being divided or it has a ratio of its frequency with respect to the frequency of the other clock signal.

In general for this configuration, GCLK will be half of VCO clock because GCLK is generated at 50% duty cycle and VCO clock is not. In general a divide by two is performed to obtain the 50% duty cycle. Thus, PLL 54 will perform at least a divide by two to obtain GCLK. Similarly, VCO Clock divider 162 performs at least a divide by two on VCO clock. Thus, for the case where VCO clock divider 162 performs the minimum division of two, source clock and GCLK are the same. For this case, the operation of system 150 and system 50 are very similar. With GCLK being the same frequency as source clock, there is only one edge of GCLK which is less than the whole period of source clock so that the only delay available is one half the period of source clock. Thus, the delay that should be designed into delay line 72 in FIG. 3 should be based on the same considerations as for FIG. 2 except based on the lowest frequency of GCLK. The clock that actually operates external circuits 114 and 116 can be slower than GCLK. This delay should be half the slowest GCLK plus some amount of margin. The margin is to ensure that lock can be avoided at near the all zeros or all ones condition.

If, for example, VCO clock divider 162 performs a divide by four, then GCLK is twice source clock and has two rising edges and two falling edges per cycle of source clock. One of those edges is for the no added delay case. Thus, clock control logic 164 selectively provides an additional offset of delay with respect to any one of the remaining three edges. These three edges can provide delays in increments of one period of VCO clock. Each of these periods is used effectively as a selectable amount of delay. Thus, the amount of delay that can be added is three periods of VCO clock which is also one and half periods of GCLK and these delays can be added in one half increments of GCLK. Thus, for this case the delay line 72 needs only to be some margin more than one half the period of GCLK, but in this case that is one fourth the period of source clock. Thus, external circuits 114 and 112 can be ensured of being locked at a lower frequency, for a given amount of delay in delay line 72, in system 150 than in system 50 if VCO clock divider 162 divides by more than two. Another way of stating this is that so long as GCLK meets the minimum speed requirement, clock out can be slower than the minimum GCLK speed and still be ensured of obtaining lock.

The function of the divide ratio signal is to provide to VCO clock divider 162 the value for how much VCO clock is to be divided to produce source clock. Assertion and deassertion of reset controls when the first rising edge of source clock occurs. Assertion of resets signals the end of a cycle of attempts to obtain lock. The subsequent deassertion of reset is timed so that the source clock is delayed an additional half cycle of GCLK. Deassertion of reset has the effect of enabling VCO clock divider 162 to produce source clock.

Figure 4:
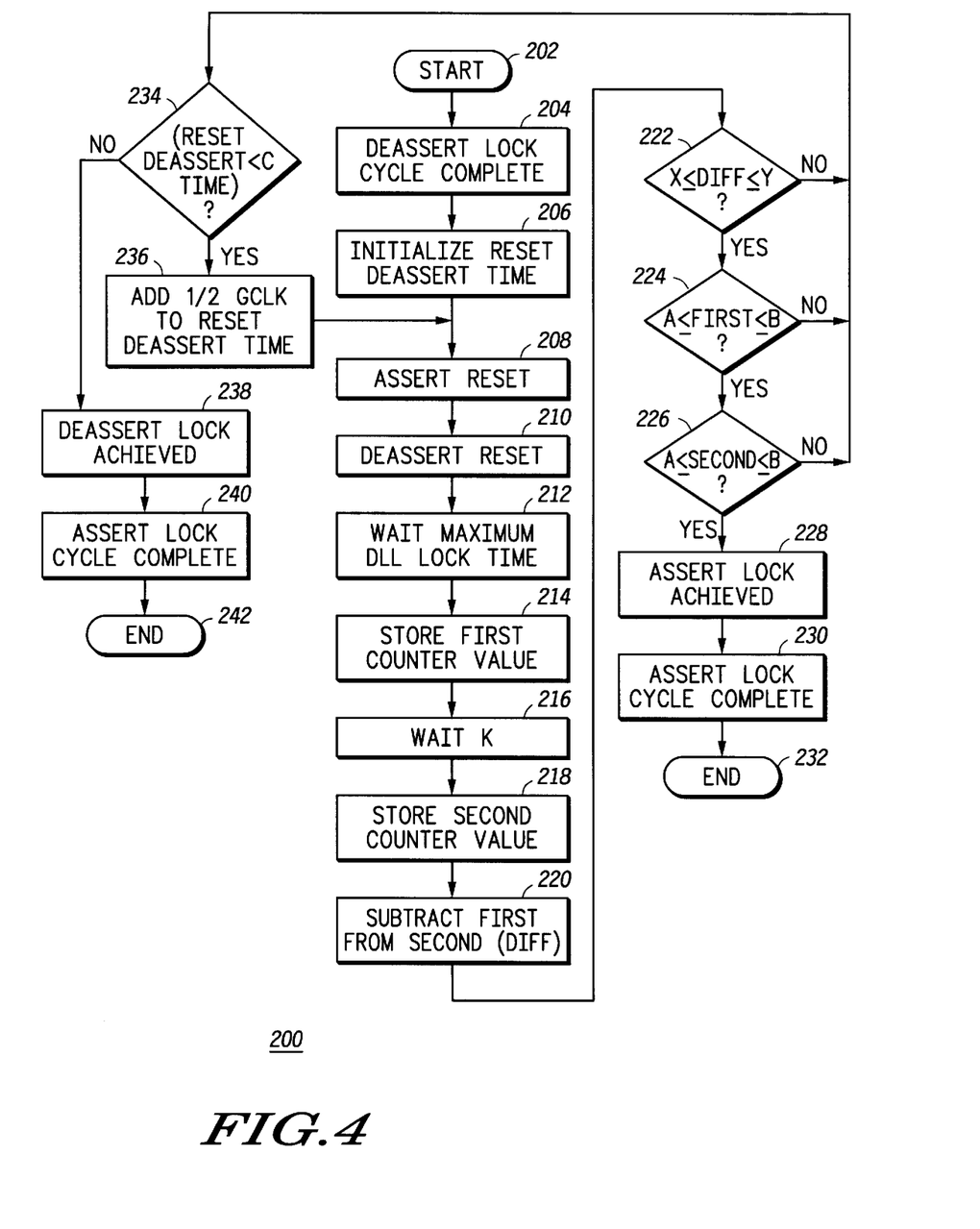
FIG. 4 is flow chart of the methodology used in the embodiments shown in FIG. 2 and FIG. 3.

Shown in FIG. 4 is a flow diagram of the methodology used in both FIG. 2 and FIG. 3. At the start, shown as 202, the lock cycle complete is de-asserted 204. There is a lock cycle complete signal which indicates that all the alternatives available have been attempted in order to achieve lock. This signal does not indicate whether lock has been achieved or not, but simply that either lock has been achieved or that all the alternatives for achieving lock have been exhausted. The next step is to initialize the reset de-assert time 206. This is the initial loading of the register which indicates the particular time at which the clock signal provided by clock control logic 164 to VCO clock divider 162 is provided. This can be just two different options, or the number of options may be 2 times the ratio of GCLK to source clock. The next step is to assert reset 208 followed by deassert reset 210. Deassert reset 210 controls when the rising edge of source clock occurs. This occurs at the particular time specified as reset de-assert time 206.The options for the time that reset is deasserted is in increments of one-half the period of GCLK. The next step is to wait the maximum DLL lock time 212.

The maximum DLL lock time is the time required for one full cycle of counter 74. Counter 74 cycles through every one of its possible outputs in an amount of time that can be accruately predicted. For example, it starts with a zero output and increments a count of one every five cycles and will continue to do so unless lock is achieved. Every time that counter 74 has an opportunity to be incremented, it will increment based upon phase detector 76 detecting that lock has not occurred. Thus, for systems 50 and 150 which use a five cycles per change approach, the amount of time to try every option of counter 74 is five times the period of feedback clock times the magnitude of counter 74. A typical magnitude for counter 74 might be 128. Thus, if the frequency of feedback clock 97 was 200 MHz, that would mean the period is 5 nanoseconds. That would make the maximum DLL lock time 25 nanoseconds times 128 if the counter 74 were at a count of 128.

After this maximum DLL lock time has expired, the first counter value in counter 74 is stored (214). There is then a wait of a magnitude K (216) which is some number which is significantly different than 128 times 5 times the period of the feedback clock. A likely number to pick would be half of that which would be easily achieved by using 64 if the counter magnitude was 128. A convenient way to do this would be 64 times 5 periods of feedback clock. After time period K, the counter value is stored (218). Thus, there is a first counter value stored and a second counter value stored. The next step is to subtract the first counter value from the second counter value and provide that difference and make a decision based upon a margin of error parameter (220). If the difference is within the predetermined margin, that means that lock has been achieved.

Shown in block 222 is the difference as compared to two numbers, X and Y. The number X would be a negative number and the number Y would be a positive number. These numbers would generally be expected to be the same, but they are not necessarily the same. It may be that if the difference is a decremented difference that you want that to be different for the same sense of margin or safety margin as a different value for incrementing. A "yes" from block 222 indicates that lock has occurred, but that doesn't satisfy all of the criteria because lock may have occurred at one of the boundaries of counter 74. As shown in block 224, the first value is compared to two values A and B. Value A would be a relatively small number near but not equal to all zeros. Value B would be a relatively large number near but not equal to all ones. How near they are to this would be the amount of margin that is believed to be necessary for safe operation. Block 226 is very similar except that it is comparing the second value. It may be that the margins may be different than simply relying on the difference shown or indicated in block 222. This is an optional test that may well not be necessary if the logic and time required to perform this test are not worth the added value of performing this test. If there is a "yes" from 226, 224, and 222, then the lock achieve signal is asserted (228). Next, or at the same time, the lock cycle complete is also asserted (230). The end is then reached.

If any of the tests in 222, 224, or 226 are negative, the next step is to go to block 234 at which the reset de-assert time is compared to the maximum value available. If it is not less than the maximum value available, that means that all of the tests have already been run. Of course, when this is first time through, that would not be the case. So, certainly for the first time through this process the answer would be "yes". In which case, the next step is to add one-half GCLK to the reset de-assert time (236). This simply would be done by incrementing the register by a count of 1. The process beginning at block 208 would be done again. The reset signal would be asserted, the de-asserted, and that would begin the wait for the maximum DLL lock time. After the DLL lock time has occurred, then the first counter value would be stored, that would be the wait period 216, then the second value would be stored. The difference would be taken and compared to the preset margins for acceptable lock. If it is "yes", then it would be again compared to the boundary conditions as shown in 224 and 226. If the answer is "yes" that it is within and not too close to the values of the boundaries of counter 74 and is within the acceptable margin for lock, then the lock's achieve signal would be asserted and the lock cycle complete signal would be asserted and the process would be finished. If the answer to any of these is "no", then the process would begin again at block 234 in which the reset de-assert time which is now stored would be compared to the maximum value. If it is still low enough which it would be unless source clock and GCLK were the same frequency.

If the process were to continue, then there would be added one-half GCLK to the reset de-assert time. The process would begin again at 208 with the new reset de-assert time and re-set would be de-asserted, wait the maximum DLL lock time and store the first value in the counter, wait the predetermined time K, store the second value, subtract the two and compare the difference to see if it is within acceptable block and also compare the absolute values to see if it is too close to the boundary. This would continue on until either lock was achieved or the reset de-assert time had reached the maximum value C. Once the re-set de-assert time reaches the value C, the lock achieve signal would remain de-asserted (238), and the lock cycle complete signal would be asserted (240) because all the alternatives for attempting lock were exhausted.

Thus, a user would know that lock could not be achieved because it would be the combination of lock not achieved, but lock cycle complete. For the case where lock is achieved, both the lock achieve signal are asserted and the lock cycle complete signal are asserted. For the case that occurs during the attempt to achieve lock, the lock cycle complete signal is de-asserted and the lock achieve signal is de-asserted.

Thus, it is seen that a delay line shorter than the maximum period of the output clock can be utilized while still retaining the same ability to obtain lock as if it were that large. Also for the cases where there may be lock for the counter 74 at near all ones or all zeros, there is the ability to provide a further delay so that lock is achieved away from this undesirable all ones or all zeros condition.

While the invention has been described in the context of a preferred embodiment, it will be apparent to those skilled in the art that the present invention may be modified in numerous ways and may assume many embodiments other than that specifically set out and described above. For example, the clock shifting circuit may be implemented completely in hardware, completely in software, or with various combinations thereof. Accordingly, it is intended by the appended claims to cover all modifications of the invention which fall within the scope of the invention.

We claim:

1. An integrated circuit which provides an output clock signal synchronized to an internal clock signal which operates the integrated circuit, comprising:
    a clock generator circuit having an input for receiving the internal clock signal, and first and second outputs for respectively providing first and second clock signals having first and second frequencies, respectively, said first frequency being an integer multiple greater than or equal to one of said second frequency;
    a clock shifting circuit having first and second inputs respectively coupled to said first and second outputs of said clock generator circuit, a first output for providing a shifted clock signal, and a second output for providing a reference clock signal, wherein said clock shifting circuit divides said first input by a predetermined divide ratio to provide a divided clock signal and selectively delays said divided clock signal by a selected delay time to provide said shifted clock signal, and provides said reference clock signal by dividing said second input by a divide ratio; and
    a delay locked loop having a reference clock input for receiving said second clock signal, a feedback clock input for receiving a feedback clock signal, a clock input for receiving the shifted clock signal, and a clock output for providing the output clock signal, wherein the delay locked loop delays the shifted clock signal by a variable delay time proportional to a phase difference between the reference clock signal and the feedback clock signal.

2. The integrated circuit of claim 1 wherein said clock generator circuit comprises a phase locked loop.

3. The integrated circuit of claim 2 wherein said phase locked loop comprises an analog phase locked loop.

4. The integrated circuit of claim 1 wherein said delay locked loop comprises:
    a phase detector having a first input for receiving said reference clock signal, a second input for receiving said feedback clock signal, and an output terminal for providing an up/down count signal in response to a phase difference between said reference clock signal and said feedback clock signal;
    a counter having an up/down count input for receiving said up/down count signal, and an output for providing a digital value; and
    a delay line having an input for receiving said shifted clock signal, a control input for receiving said digital value, and an output for providing the output clock signal delayed from said shifted clock signal by said variable delay time.

5. The integrated circuit of claim 1 further comprising:
    a first integrated circuit terminal for providing the output clock signal; and
    a second integrated circuit terminal for receiving said feedback clock signal.

6. In an integrated circuit which provides an output clock signal synchronized to an internal clock signal which operates the integrated circuit, a method for controlling a delay locked loop having a delay line which delays a source clock in response to a phase difference between a reference clock signal and a feedback clock signal, comprising the steps of:
    generating first and second clock signals in response to the internal clock signal, said first clock signal being an integer multiple of said second clock signal;
    providing the reference clock signal which is related to said second clock signal by an interface ratio;
    dividing said first clock signal by a divide ratio to provide a divided clock signal;
    selectively delaying said divided clock signal by an integer number of half periods of said second clock signal relative to a start of a cycle of said reference clock signal to provide the source clock;
    providing said source clock to an input of a delay line of said delay locked loop; and
    providing an output of the delay line as the output clock signal.

7. The method of claim 6 wherein the step of delaying said divided clock signal comprises the step of:
    iteratively changing said integer number of half periods of said second clock signal until said delay locked loop locks.

8. The method of claim 7 wherein the step of delaying said divided clock signal further comprises the step of:

determining said integer number of half periods of said second clock signal such that a variable delay time of said delay line is between minimum and maximum delay times thereof.

9. The method of claim 8 wherein the step of determining comprises the step of:

comparing an output of a counter of said delay locked loop to minimum and maximum values corresponding to said minimum and maximum delay times, respectively.

10. In an integrated circuit, a method for providing an output clock signal synchronized to an internal clock signal which operates the integrated circuit, comprising the steps of:

generating first and second clock signals in response to the internal clock signal, said first clock signal being an integer multiple of said second clock signal;

providing a reference clock signal related to said second clock signal by an interface ratio;

dividing said first clock signal by a divide ratio to provide a divided clock signal;

selectively delaying said divided clock signal by an integer number of half periods of said second clock signal relative to a start of a cycle of said reference clock signal to provide a shifted clock signal;

providing said shifted clock signal to an input of a delay line;

providing an output of the delay line as the output clock signal;

receiving a feedback clock signal at an input terminal of the integrated circuit;

determining a phase error between said reference clock signal and said feedback clock signal;

selectively incrementing or decrementing a counter in response to said phase error; and setting a delay of said delay line in response to a value of said counter.

11. The method of claim 10 wherein the step of delaying said divided clock signal comprises the step of:

iteratively changing said integer number of half periods of said second clock signal until said reference clock signal locks to said feedback clock signal.

12. The method of claim 11 wherein the step of delaying said divided clock signal further comprises the step of:

determining said integer number of half periods of said second clock signal such that a variable delay time of said delay line is between minimum and maximum delay times thereof.

13. The method of claim 12 wherein the step of determining comprises the step of:

comparing an output of a counter to minimum and maximum values corresponding to said minimum and maximum delay times, respectively.

* * * * *